United States Patent [19]

Higgins, III.

[11] Patent Number: 5,019,880
[45] Date of Patent: May 28, 1991

[54] HEAT SINK APPARATUS

[75] Inventor: Leo M. Higgins, III., Middleboro, Mass.

[73] Assignee: Prime Computer, Inc., Natick, Mass.

[21] Appl. No.: 142,462

[22] Filed: Jan. 7, 1988

[51] Int. Cl.$^5$ ............................................. H01L 23/02
[52] U.S. Cl. ......................................... 357/81; 357/82; 165/80.3; 361/383
[58] Field of Search ................... 357/81, 82; 165/80.3; 361/383

[56] References Cited

U.S. PATENT DOCUMENTS

| | | | |
|---|---|---|---|
| 3,881,547 | 5/1975 | Lavering | 165/80.3 |
| 4,291,364 | 9/1981 | Andros et al. | 165/80.3 |
| 4,541,004 | 9/1985 | Moore | 357/81 |
| 4,715,438 | 12/1987 | Gabuzda et al. | 357/81 |
| 4,768,581 | 9/1988 | Gotwald et al. | 165/80.3 |

FOREIGN PATENT DOCUMENTS 832795  5/1981  U.S.S.R. .............................. 361/383

OTHER PUBLICATIONS

IBM Technical Disclosure Bulletin, vol. 29, No. 2, Jul. 1986, pp. 768-769.

Primary Examiner—Rolf Hille
Assistant Examiner—Steven Loke
Attorney, Agent, or Firm—Wolf, Greenfield & Sacks

[57] ABSTRACT

A heat sink apparatus for convective cooling of circuit packages or components by direct impinging fluid operation employing a housing having an inlet port and a plurality of radially fluid flow passages communicating with the inlet port with each passage also having an outlet port. A fluid deflection member is supported with the housing in line with the inlet port and is provided with a deflection surface adapted to redirect the fluid flow from the inlet port to the air flow passages.

24 Claims, 5 Drawing Sheets

HEAT SINK APPARATUS

BACKGROUND OF THE INVENTION

1. Field of the Invention

The present invention relates in general to a heat sink apparatus used in association with electronic or microelectronic circuit components and/or packaging. More particularly, the present invention relates to an impinging fluid heat sink adapted to provide more direct convective cooling.

2. Background Discussion

Heat sinks are used extensively in connection with electronic and microelectronic components and packaging. Traditionally, these heat sinks are relatively large metallic structures. The heat is conducted through the structure and drawn from the surface of the structure by forcing air over the exterior surface area of the heat sink device. In order to provide sufficient convective cooling these devices are often large and heavy. Furthermore, these devices usually have relatively large flow rates of fluids to achieve sufficient convective cooling. In this connection the direction of fluid flow is generally across the board upon which the components or packaging is mounted.

OBJECTS OF THE INVENTION

One object of the present invention is to provide an improved heat sink apparatus having a low weight and maximum convective surface area while at the same time providing for a maximum flow rate of fluid over the convective surface.

A further object of the present invention is to provide a heat sink apparatus that has a relatively large surface area and is yet of compact design and in which the air flow actually is through the device in a preferred fully directed and ducted, air constraining fluid flow path.

Still another object of the present invention is to provide an improved heat sink apparatus or device to which are mounted electronic components or packages and which is characterized by acceleration of air through the device over the heat exchanging surfaces thereof.

Another object of the present invention is to provide a heat sink apparatus that is compact in design, highly efficient in operation, that is relatively simple to fabricate, and that can be manufactured at a reasonable cost.

Still another object of the present invention is to provide a heat sink apparatus that has a relatively large thermal mass directly under the hot integrated circuit.

SUMMARY OF THE INVENTION

To accomplish the foregoing and other features and advantages of the invention, there is provided a heat sink apparatus that is adapted to receive forced air from an air source such as an air blower. The heat sink apparatus includes means for receiving a microelectronic package or component that is to be maintained at a preferred temperature by a forced air cooling. The heat sink apparatus comprises a heat sink housing including means defining a substantially centrally disposed inlet port and means defining a plurality of radially extending air flow passages communicating with the inlet port and with each of these passages having an outlet port. Means are provided for directing the air flow to the inlet port. This means may comprise a duct or the like. Within the housing there is provided a fluid deflection member. This member is supported in line with the inlet port and has a deflection surface adapted to redirect the air flow from the inlet port to the air flow passages. Thus, the passages through the heat sink may be considered actually as being comprised of a converging portion and a diverging portion. The function of the converging portion is to increase velocity of the fluid and lower its static pressure. The diverging portion serves to change the area of the fluid stream back to that at the inlet port thus converting velocity head to pressure head.

In connection with further specific features of the present invention, the air deflection member has a base and top end with the base being wider than the top end and with the deflection surface extending between the base and top end. The fluid deflection member has an apex and is preferably of modified conical shape, although, in an alternate embodiment the member may be of conical shape. The modified conical shape is one in which the deflection surface is concave about the deflection member rather than a straight conical surface. The housing has a bottom wall in which the deflection member base is disposed. The deflection surface extends circumferentially so as to redirect air flow about a 360 degree range. In addition to the housing bottom wall, the housing also has a top wall having the inlet port defined therein. The means that define the plurality of radially extending air flow passages is comprised of a plurality of radially disposed fins extending between the top and bottom housing walls. In one embodiment the fins terminate at their inner end at the deflection surface while at another embodiment the fins terminate at their inner end at the deflection member base. The fins may be straight, may have a corrugated cross section or may have a wavy cross section, or may be interconnected in a fan pattern. In still a further embodiment of the invention, the means defining a plurality of radially extending air flow passages may be comprised of a series of spaced pins disposed along radial locii. In still another embodiment of the invention, the air flow passages may be defined by horizontally oriented cylindrical or conical tubes. With respect to the inlet duct, this may have associated therewith an elastomeric ring between the inlet duct and heat sink housing. In an alternate embodiment the inlet duct may be supported with an air gap between the heat sink housing and the inlet duct to control back pressure.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

And now, in accordance with the present invention there is provided an improved heat sink apparatus that is of relatively compact design and provides a relatively large surface area for forced air cooling. Rather than passing the air flow over the circuit board and over the traditional heat sink, in accordance with the present invention the air flow is confined to a flow path that is essentially through the heat sink device and thus in more direct contact with the support for the circuit package or component, the heat of which is being dissipated.

In accordance with the invention the internal cavities or passages, to be described in further detail hereinafter, are constructed to have both a converging portion and a diverging portion. The function of the diverging portion is to increase velocity of the fluid while lowering its static pressure. A pressure difference between converging and diverging portion develops. The diverging portion serve to change the area of the fluid stream back to that of the inlet area. The diverging portion causes the velocity of fluid at the outlet of said heat sink to be less than the entrance velocity thereby significantly decreasing the audio noise associated with the fluid flow.

Figure 1:
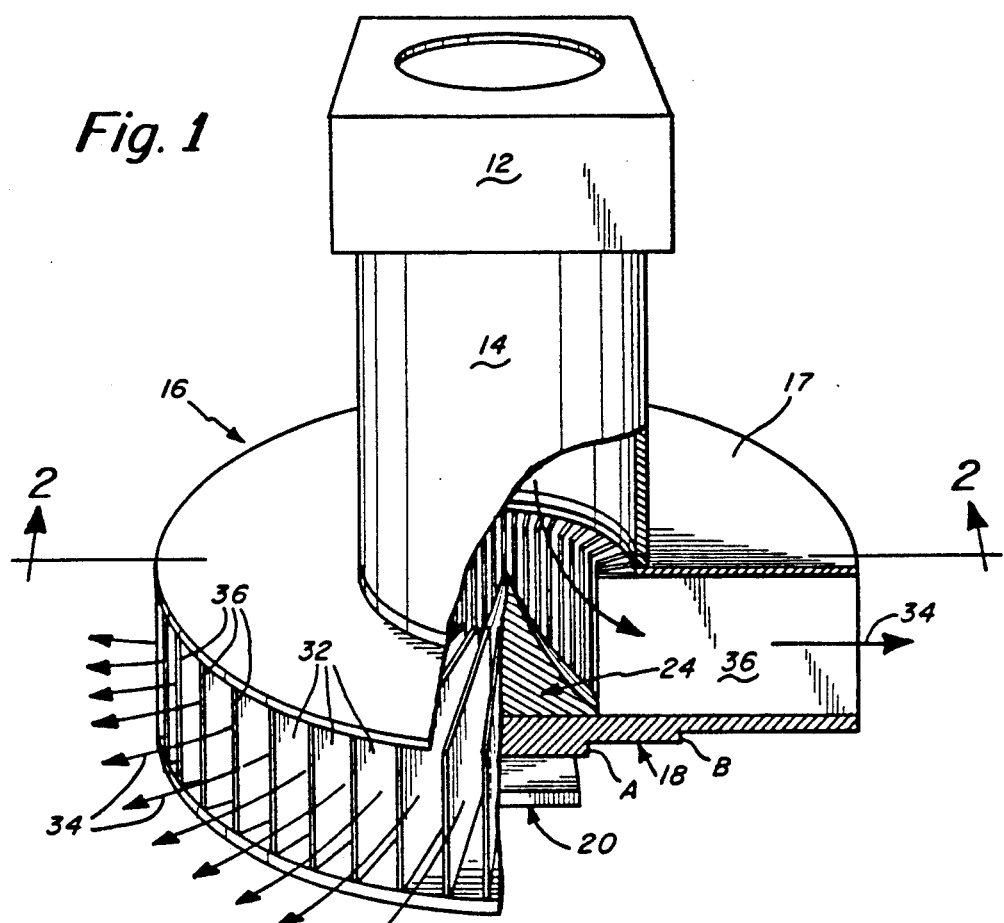
FIG. 1 is a perspective view, partially cut-away and illustrating a preferred embodiment of the heat sink apparatus of the present invention.

The heat sink apparatus of the present invention, such as embodied in FIG. 1, provides very large heat sink mass directly behind the hot device. This relatively large heat sink mass also has the dual purpose of functioning as an air guide to direct air into the outlet channels or passages. It is preferred in accordance with the present invention that the heat sink apparatus be fully ducted thus constraining the cooling air from inlet to outlet.

Figure 2:
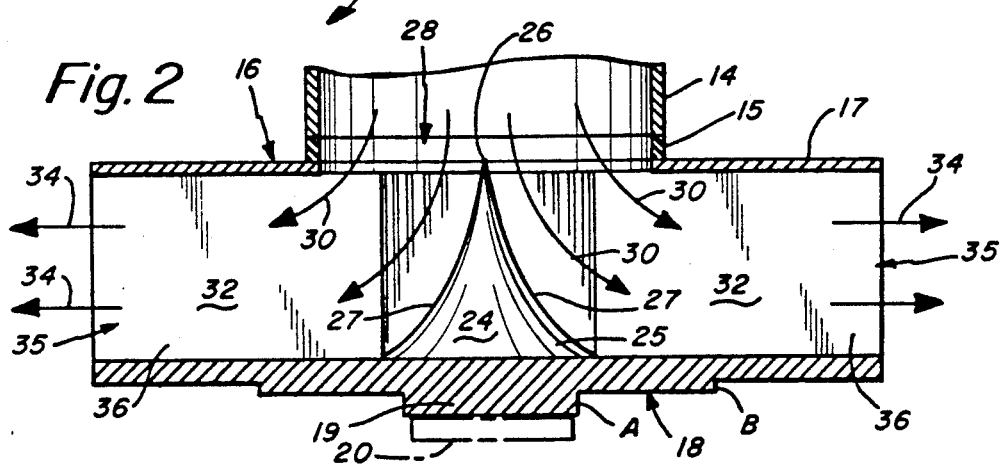
FIG. 2 is a cross sectional view taken along line 2—2 of FIG. 1.
Figure 6:
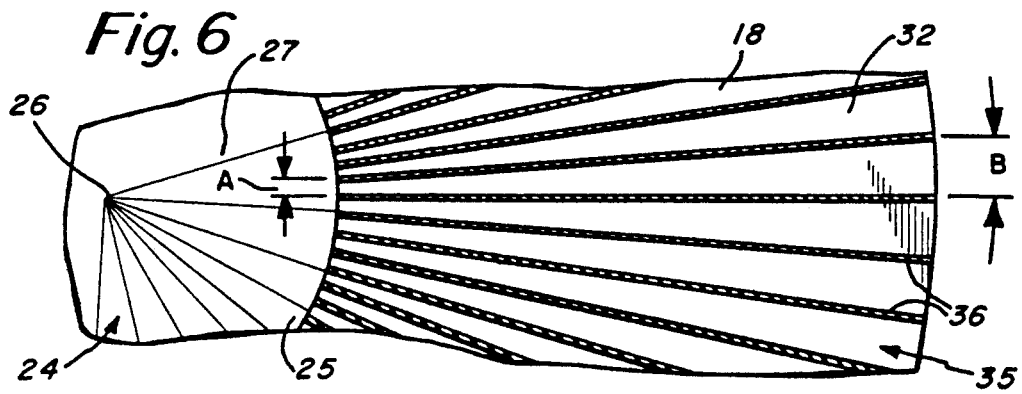
FIG. 6 is a fragmentary plan view partially broken away of the heat sink apparatus of FIG. 1 illustrating the straight fin construction.

Reference is now made to a preferred embodiment illustrated in FIGS. 1, 2 and 6. FIG. 1 is a perspective view partially broken away to show the internal construction of the heat sink apparatus. FIG. 2 is a cross sectional view through the heat sink apparatus and FIG. 6 is a fragmentary plan view partially broken away. The heat sink apparatus is adapted to receive forced air from a source and in this connection in FIG. 1 refer to the fan or blower 2 that is mounted on the duct 14. The duct 14 couples from the blower 12 to the heat sink apparatus. In this embodiment of the invention, as illustrated in FIG. 2, between the heat sink apparatus 16 and the duct 14 there is provided a elastomeric ring 15 for sealing the joint therebetween so that the air flow is sealed and restricted from the duct 14 to the heat sink apparatus.

The heat sink apparatus of the present invention is comprised of a heat sink housing including a top wall 17 and a bottom wall 18. The bottom wall 18 may be stepped as illustrated in FIGS. 1 and 2 and is adapted to support the circuit component illustrated in FIG. 1 at 20. The circuit component 20 or a similar microelectronic component or package may be secured to the bottom wall 18 in a suitable manner to provide intimate contact for good conduction of heat from the circuit component 20 to the bottom wall 18. As viewed in FIGS. 1 and 2, the wall 18 at its central area 19 has a relatively substantial thickness to provide a mass of heat conductive metal (thermal mass) to provide good heat conduction from the component 20 to the heat sink apparatus.

As indicated previously, the wall 18 is provided with the steps. These are illustrated in FIGS. 1 and 2 as steps A and B. The step A provides an attachment platform for the circuit components 20 and generally has dimensions comparable with the dimensions of the component housing, package, or substrate. The step B is generally used only if one maintains an air gap between the heat sink and component assembly. This provides a low capacitance path between the package and the heat sink reducing the heat sink to package bond area to thus minimize stress and strain across the interface due to the fact that materials possessing different coefficients of thermal expansion are being joined.

The heat sink apparatus is also comprised of a fluid deflection member 24 that is disposed on the bottom wall 18 and has a base 25 preferably of circular configuration and extending to substantially overlap the central area 19 of the bottom wall 18. The fluid deflection member 24 is either integral with the bottom wall 18 or is intimately fixed thereto. Again, the fluid deflection member 24 provides part of the aforementioned large heat sink mass while furthermore providing an air guide and adding to the thermal mass directly under the component. With respect to the air guidance provided by the fluid deflection member 24, refer to FIG. 2. The fluid deflection member 24 has an apex 26 that terminates at an inlet port 28. The inlet port 28 is formed at the central area of the top wall 17 of the heat sink 16. The fluid deflection member 24 in FIG. 2 is of modified conic configuration and instead of being formed by a straight surface from the apex to the base it is provided with a deflection surface 27 that is concave. This concave surface redirects the surface flow from the inlet port 28 preferably in a right angle manner to the outlet air flow passages 32. It is noted in the embodiment of FIG. 2 that the apex 26 terminates substantially at the center of the inlet port 28.

As indicated previously, fluid deflection member 24 has concave deflection surface 27 that redirects the air flow as indicated by the arrows 30 in FIG. 2 so that the air, as it progresses through the inlet port 28, is redirected orthogonally into the plurality of radially extending air flow passages 32. FIG. 2 also shows the arrows at 34 wherein the air exits at the outlet ports 35.

In the embodiment illustrated in FIGS. 1, 2 and 6, as indicated previously, the heat sink apparatus has a converging portion which essentially is the portion thereof leading from the inlet to the fluid deflecting member 24. The diverging portion is comprised by the aforementioned passages 32. These plurality of radially extending air flow passages are defined by a like plurality of radially extending fins 36. In the embodiment illustrated in FIGS. 1, 2 and 6 the fins are of rectangular shape and are, of course, disposed more closely together in adjacent positions at the inlet of the passages than at the outlet. In this regard, refer to FIG. 6 and the smaller dimension A in comparison to the larger dimension B. Also, in this embodiment it is noted that the fins 36 are planar. On the inside the fins terminate at the very periphery of the base 25 of the fluid deflection member 24.

As indicated previously, in the embodiment of FIG. 6 the fins 36 are planar. These fins could also be of rippled or corrugated construction. This fins may have a vertically directed ripple or corrugation to them. This further increases the heat exchange surface area while not substantially increasing back pressure or turbulance.

As can be discerned from FIG. 2, in the vicinity of the circuit component 20, there is a relatively large metal heat conductive sink mass comprised of the central portion 19 of the bottom wall 18 and the fluid deflection member 24. The orthogonal relationship between the inlet of air and the exit of air provides for a relatively rapid flow sweeping action of the fluid as it enters the inlet port 28 and is deflected by the fluid deflection member 24 to the outlet passages 32. The combination of the inlet port construction with the air fluid deflection member 24 and the outlet passages provides a venturi effect. The essentially V shaped configuration of the passages 32 provides the ability to accelerate air through the apparatus.

A reference is now made to several alternate embodiments of the present invention in FIG. 3-5 and 7-12. In all of these embodiments like reference characters are used to identify the same parts already described in connection with FIGS. 1, 2 and 6.

Figure 3:
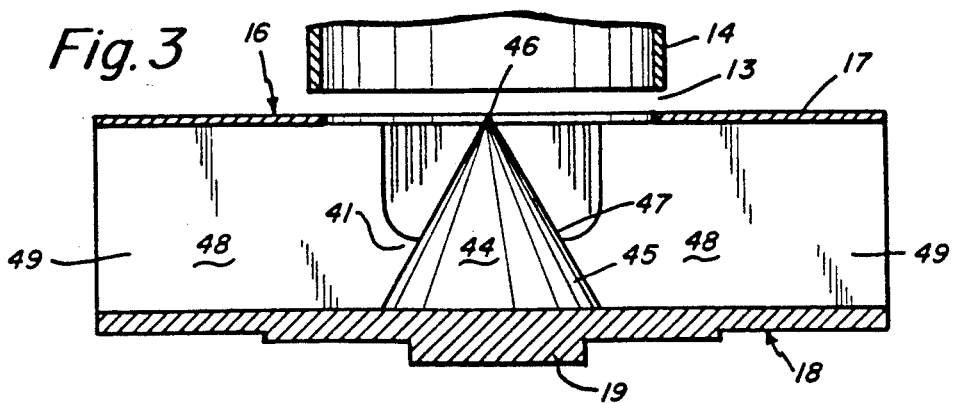
FIG. 3 is a cross-sectional view similar to the view of FIG. 2 but for an alternate embodiment of the invention employing a purely conic fluid deflection member and an air gap between the inlet duct and heat sink housing.

FIG. 3 illustrates a cross sectional view of a first alternate embodiment of the present invention in which the heat sink apparatus 16 has a top wall 17 and a bottom wall 18. In this embodiment deflection member 44 is of conic shape having a base 45 and a apex 46 and a linearly extending fluid deflection surface 47. In this embodiment there are also provided a plurality of radially extending air flow passages 48 defined by a like plurality of fins 49. In the particular embodiment of FIG. 3 it is noted that the fins are substantially of rectangular shape but include one inner section that, instead of terminating at the very base 45, terminates part way up the fluid deflection surface 47 as illustrated at 41 in FIG. 3.

FIG. 3 also illustrates an alternate embodiment of the means for coupling the forced air to the heat sink apparatus. It is noted in FIG. 3 that the duct 14 does not mate directly with the heat sink apparatus but instead there is provided a gap 13. This air gap may be on the order of ⅛ inch and may be used in certain applications to reduce back pressure.

Figure 4:
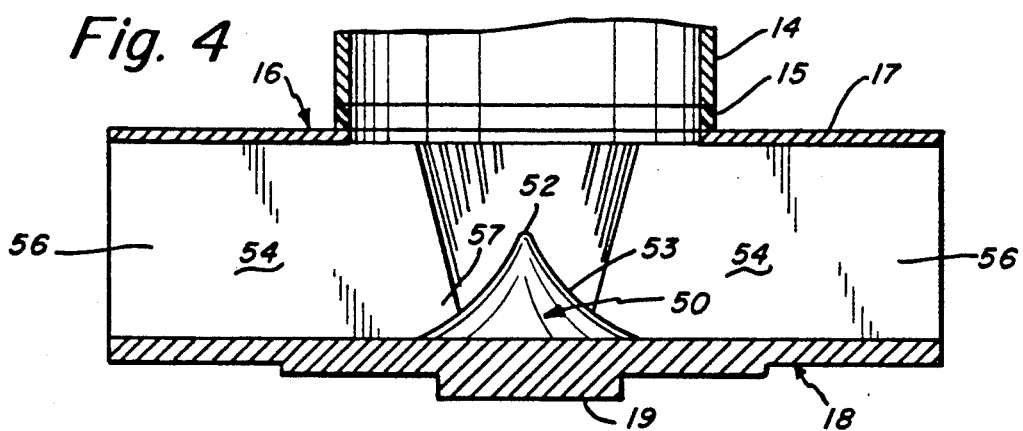
FIG. 4 is a cross sectional view showing still a further embodiment of the present invention employing a modified conical fluid deflection member of reduced height.

FIG. 4 illustrates a cross-sectional view of a further alternate embodiment of the present invention employing a fluid deflection member 50 that is generally of the same shape as the member 24 in FIG. 2 but is of substantially, reduced height. It is noted in FIG. 4 that the height of the member 50 is about ½ of the height of the member 24 in FIG. 2. Also, the apex 52 of the member 50 is somewhat rounded. As in the embodiment of FIG. 2, in FIG. 4 the fluid deflection member 50 is of modified conic form including an annularly disposed concave air deflection surface 53 leading to air passages 54.

In FIG. 4 the plurality of radially extending air flow passages 54 is defined by a like plurality of fins 56. Once again the fins 56 are substantially of rectangular shape but include a portion 57 that is angled as illustrated in FIG. 4 so as to join part way up on the concave surface 53 of the fluid deflection member 50.

Figure 5:
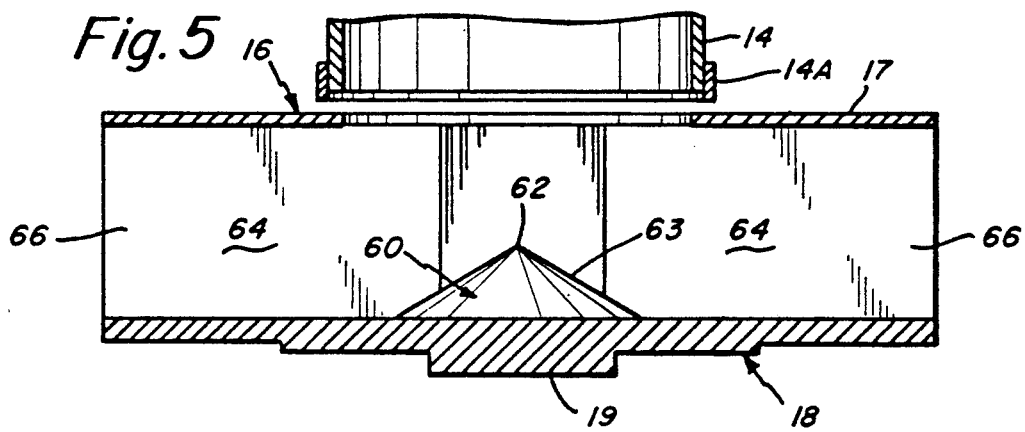
FIG. 5 is a cross sectional view of still further alternate embodiment employing a purely conic deflection member of reduced height and furthermore illustrating an adjustable collar associated with the inlet duct for controlling the air gap.

The cross sectional view of FIG. 5 illustrates still a further embodiment of the present invention employing a conically shaped fluid deflection member 60 having an apex 62. In the embodiment of FIG. 5, the conic member 60 is of substantially reduced height in comparison to the conic member 50 of FIG. 3. In this embodiment the height of the conic member 60 may be in a range of ⅓ to one half of the full height as illustrated in FIG. 3. In FIG. 5 there are a plurality of radially extending air flow passages 64 defined by a like plurality of radially extending fins 66. In the embodiment of FIG. 5 the fins 66 are of substantially rectangular shape but once again terminate partially up the linear deflection surface 63 of the conic member 60.

In FIG. 5 it is also noted that the duct 14 is provided with an adjustable collar 14A that may be used to adjust the height of the gap between the duct and the heat sink device.

Reference is now made to FIGS. 7-12 for alternate constructions of the means for defining the plurality of radially extending air flow passages. This means is usually in the form of a plurality of fins but in one embodiment, namely FIG. 9, to be described in further detail hereinafter, spaced pins are used.

Figure 7:
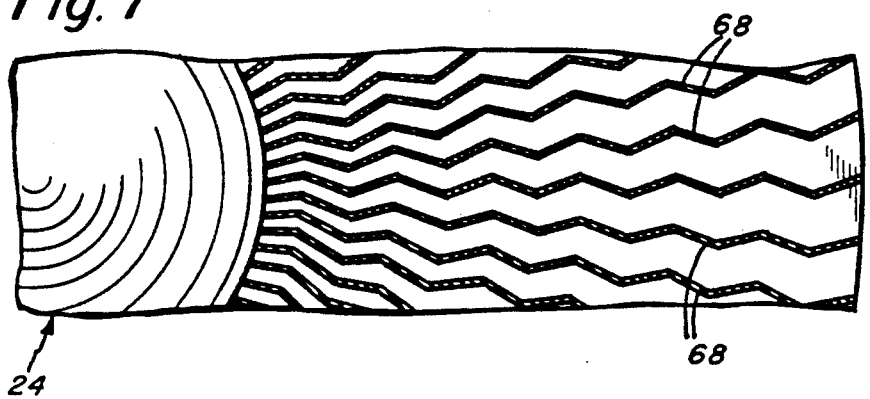
FIG. 7 is a fragmentary plan view of an alternate embodiment employing an alternate fin construction that may be referred to as a corrugated or zig zag fin construction.
Figure 8:
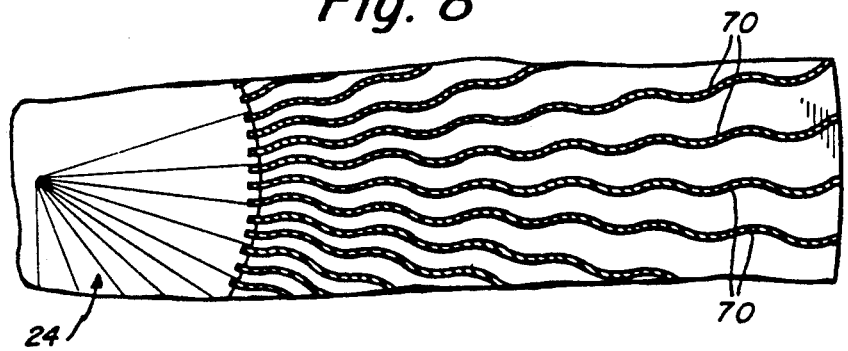
FIG. 8 is a fragmentary plan view of still a further embodiment of the invention employing a wavy fin construction.
Figure 9:
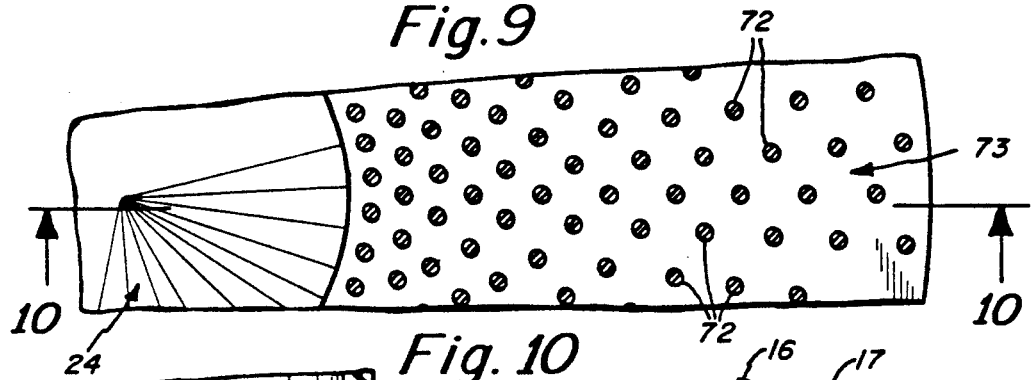
FIG. 9 is a fragmentary plan view of still a further embodiment of the present invention in which the radially extending air flow passages are defined by spaced pins disposed along radial locii.
Figure 10:
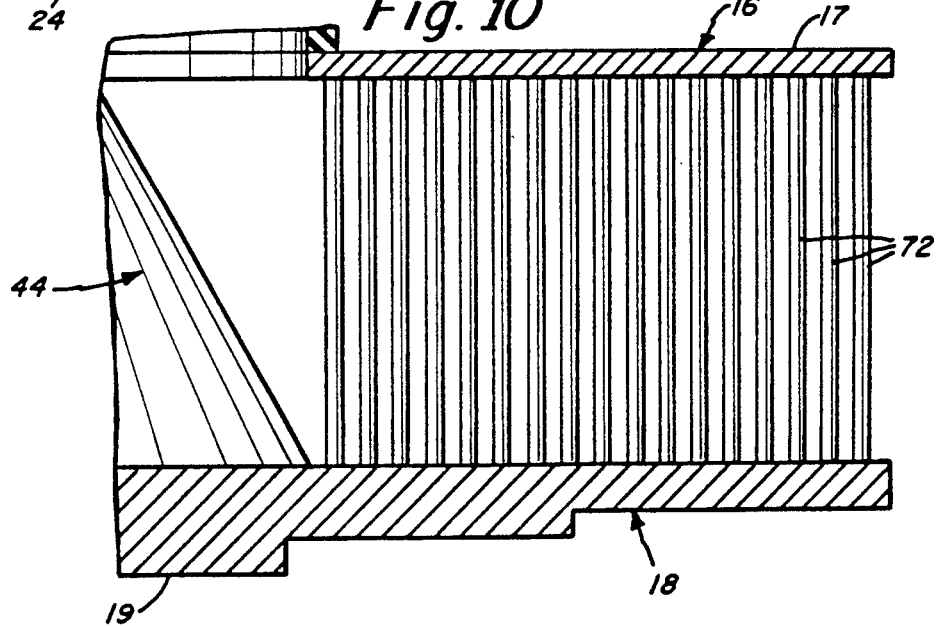
FIG. 10 is a cross sectional view taken along line 10—10 of FIG. 9.

FIG. 7 illustrates the passages being defined by corrugated or zig zag fins 68. In the embodiment of FIG. 8 the radially extending passages are defined by fins 70 that are of wavy shape. In the embodiment of FIG. 9 the fins are replaced by a series of spaced pins 72. The pins 72 in the illustration of FIG. 9 are disposed along radial locii thus essentially providing radially extending air flow passages such as the passage 73 illustrated in FIG. 9. FIG. 10 is a cross sectional view taken along line 10—10 of FIG. 9 illustrating the vertical placement of these spaced pins 72. The pins 72 extend between the top wall 17 and the bottom wall 18 of the heat sink 16.

Figure 11:
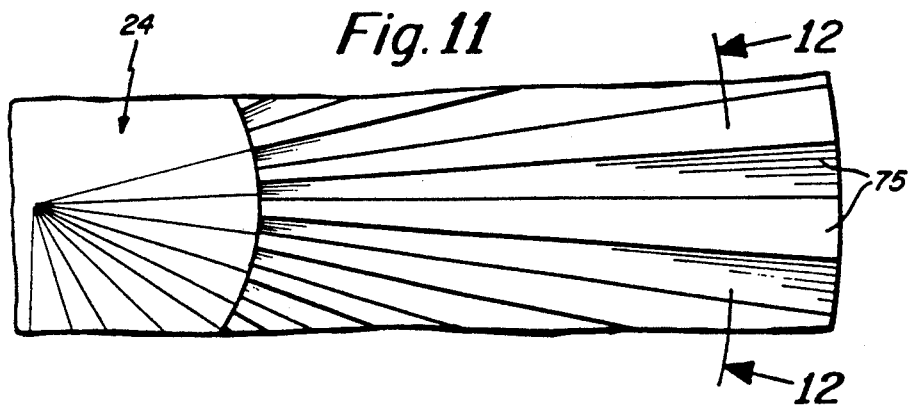
FIG. 11 is a fragmentary plan view of still a further embodiment of the present invention in which the radially extending air flow passages are formed by fins disposed in a fan pattern.
Figure 12:
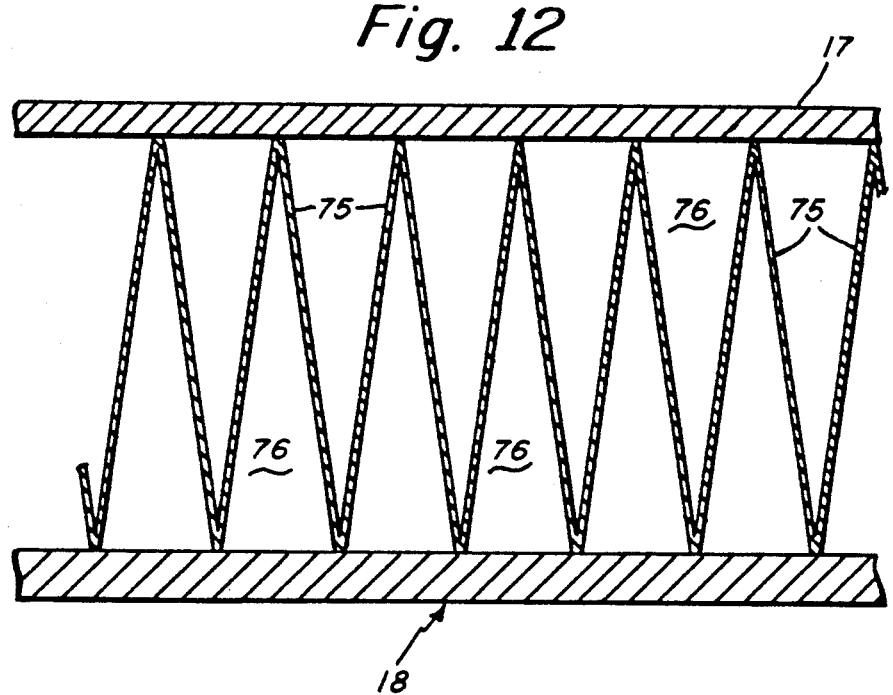
FIG. 12 is a cross sectional view taken along line 12—12 of FIG. 11 showing this fan pattern.

The zig-zag or corrugated construction illustrated in horizontal cross-section of FIG. 7, substantially increases the heat exchange area and turbulence. Increased turbulence improves the heat exchange at the fluid fin interface. However, this may create a [back pressure] which will require increase in the blower power. FIGS. 11 and 12 illustrate a further embodiment disclosed herein for the radial passage construction. This fin construction is in the form of a "Japanese" fan configuration including angularly disposed fan walls 75 defining substantially triangular cross section passages 76. As illustrated in the cross-sectional view of FIG. 12, the walls 75 extend angularly between the top wall 17 and the bottom wall 18 of the housing. This staggered fan construction provides the aforementioned triangular shape radially extending air flow passages 76.

Figure 13:
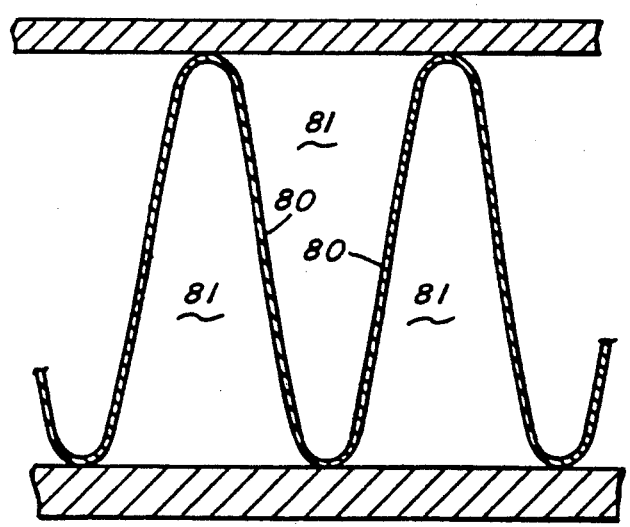
FIG. 13 is a cross-sectional view similar to the view of FIG. 12 but for an alternate construction in which the fan pattern has a sinusoidal cross section.

FIG. 13 is a further cross-sectional view similar to the view of FIG. 12 but illustrating a different fan configuration. In this arrangement the fan walls 80 define passages 81. The walls 80 are disposed in a substantial sinusoidal pattern as illustrated.

Figure 14:
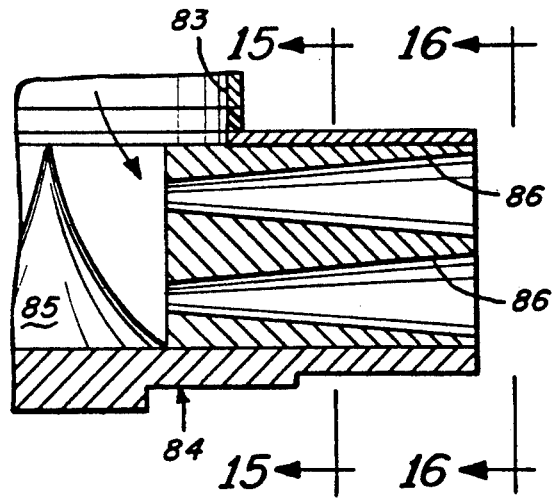
FIG. 14 is a fragmentary cross sectional view for still a further embodiment of the present invention in which the radial passages are defined by horizontally disposed cylindrical or conical tubes.
Figure 15:
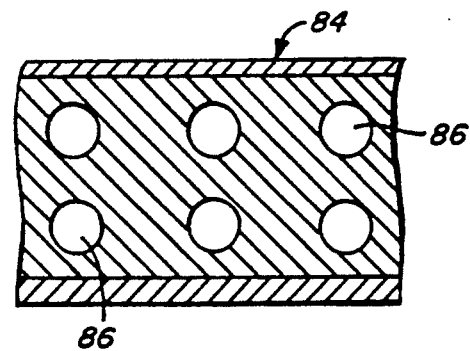
FIG. 15 is a cross sectional view taken along line 15—15 of FIG. 14.
Figure 16:
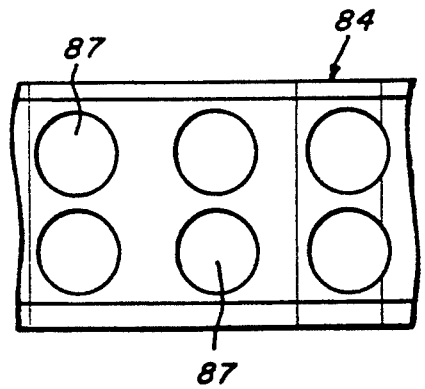
FIG. 16 is a cross-sectional view taken along line 16—16 of FIG. 14.

Reference is now made to still a further embodiment of the present invention illustrated in FIGS. 14–16. The particular arrangement described in this embodiment is one in which the air flow is directed horizontally by means of horizontally oriented cylindrical or conical tubes. More particularly, in the drawing there is shown the heat sink apparatus including the inlet duct 83, housing 84, and deflection member 85. At the outlet side of the housing there are provided a plurality of tubes 86 which in the embodiment of FIG. 15 are of conical configuration. The tubes 86 may also be of cylindrical tube configuration. The cylindrical tubes provide the same size air inlet port as air outlet port. The conical tubes are preferred because they have the larger outlet port. In this regard refer to FIGS. 15 and 16 showing these tubes 86 and also illustrating in particular in FIG. 16, the larger diameter outlet ports 87.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. A heat sink apparatus adapted to receive forced air from a source and comprising;
a heat sink housing including upper and lower walls, an opening in said upper wall defining a substantially centrally disposed inlet port and means extending between said upper and lower walls defining a plurality of radially extending enclosed airflow passages communicating with said inlet port and each having an outlet port,
enclosed means for directing the air flow from said source to said inlet port,
and an air deflection member supported in said housing in-line with said inlet port, said air deflection member having a base and top end with said base wider than said top end, having a deflection surface extending between the base and top end, said deflection surface adapted to re-direct the air flow from the inlet port in a substantially orthogonal direction to said air-flow passages, and wherein said top end terminates at the inlet port substantially in an apex so as to inhibit reverse pair currents.

2. A heat sink apparatus as set forth in claim 1 wherein the apex of said air deflection member is disposed substantially at a point in the plane defined by the inlet port.

3. A heat sink apparatus as set forth in claim 1 wherein the apex of the air deflection member is disposed with the height thereof measured form the base being equal to or lower than the height of the inlet port as measured from the housing lower wall.

4. A heat sink apparatus as set forth in claim 1 wherein said air deflection member is of substantially conical shape.

5. A heat sink apparatus as set forth in claim 1 wherein said deflection surface extends circumferentially so as to re-direct air flow about a 360 degree range.

6. A heat sink apparatus as set forth in claim 5 wherein said deflection member has a concave deflection surface.

7. A heat sink apparatus as set forth in claim 1 wherein said air deflection member has a substantially conical shape, said housing has a bottom wall upon which the deflection member base is disposed, and said means defining a plurality of radially extending air-flow passages is comprised of a plurality of radially disposed fins extending between said top and bottom walls.

8. A heat sink apparatus as set forth in claim 7 wherein said fins terminate at their inner end at said deflection surface.

9. A heat sink apparatus as set forth in claim 7 wherein said fins terminate at their inner end at said deflection member base.

10. A heat sink apparatus ass set forth in claim 7 wherein each fin has a corrugated cross-section extending vertically and horizontally entirely across the full length of the fin.

11. A heat sink apparatus as set forth in claim 7 wherein each fin has a wavy cross-section extending vertically and horizontally entirely across the full length of the fin.

12. A heat sink apparatus as set forth in claim 7 wherein the fins are interconnected in a fan pattern including one of straight and wavy configuration.

13. A heat sink apparatus as set forth in claim 7 wherein said means defining a plurality of radially extending g air-flow passages is comprised of a series of spaced pins disposed along a radial locus.

14. A heat sink apparatus as set forth in claim 1 wherein said means for directing the air flow includes an inlet du t.

15. A heat sink apparatus as set forth in claim 14 including an elastomeric ring between said inlet duct and heat sink housing.

16. A heat sink apparatus as set forth in claim 14 wherein said inlet duct is supported with an air gap between it and said heat sink housing.

17. A heat sink apparatus as set forth in claim 1 wherein said means for defining a plurality of radially extending air flow passages is comprised of a series of spaced pins disposed along a radial locus with adjacent pins being on the same circumference.

18. A heat sink apparatus as set forth in claim wherein said means defining a plurality of radially extending air flow passages is comprised of a series of spaced pins disposed along a radial locus with adjacent pins on a staggered circumference.

19. A heat sink apparatus as set forth in claim 1 wherein said means defining a plurality of radially extending air flow passages is comprised of radially extending tube means.

20. A heat sink apparatus as set forth in claim 19 wherein aid tube means are of conical configuration.

21. A heat sink apparatus adapted to receive forced air from a source, comprising:
a heat sink housing comprising upper and lower walls, a substantially centrally disposed opening in said upper wall defining an inlet port, said lower wall being substantially thicker than said upper wall and further comprising means for mounting a device to be cooled to the underside surface of said lower wall, means extending between said upper and lower walls defining a plurality of radially extending air-flow passages communicating with said inlet port and each having an outlet port, said means being peripherally located so as to provide a central passageway in said housing, enclosed means mounted over said inlet port for conducting air flow from said source through said inlet port to said central passageway, an air deflection member mounted on the lower wall of said housing within said central passageway in-line with said inlet port and having a deflection surface adapted to direct the air flow for the inlet port through said central passageway and to the radially extending air-flow passages, said housing and means defining air flow passages being arranged so that there is unimpeded air flow from each of the outlet ports radially therefrom about the entire periphery of the housing, wherein said air deflection member has a base and top end with said base wider than said top end and wherein said top end terminates at the inlet port substantially in an apex so as to inhibit reverse air currents.

22. The heat sink apparatus of claim 21 wherein the lower wall has a stepped outer surface, with each step being of successively reduced are, the smallest area step being freshest from the deflection member.

23. A heat sink apparatus as set forth in claim 21 wherein the apex of said air deflection member is disposed substantially at a point in the plane defined by the inlet port.

24. A heat sink apparatus as set forth in claim 21 wherein the apex of said air deflection member is disposed with the height thereof measured from the base being equal to or lower than the height of the inlet port as measured from the housing lower wall.

* * * * *